(12) United States Patent
Mori

(10) Patent No.: US 10,361,183 B2
(45) Date of Patent: Jul. 23, 2019

(54) ELECTROSTATIC PROTECTIVE DEVICE AND ELECTROSTATIC PROTECTIVE CIRCUIT

(71) Applicant: SONY SEMICONDUCTOR SOLUTIONS CORPORATION, Kanagawa (JP)

(72) Inventor: Hideki Mori, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/326,555

(22) PCT Filed: Jul. 8, 2015

(86) PCT No.: PCT/JP2015/069623
§ 371 (c)(1),
(2) Date: Jan. 16, 2017

(87) PCT Pub. No.: WO2016/013396
PCT Pub. Date: Jan. 28, 2016

(65) Prior Publication Data
US 2017/0207212 A1    Jul. 20, 2017

(30) Foreign Application Priority Data
Jul. 25, 2014    (JP) .................................. 2014-152225

(51) Int. Cl.
*H01L 27/01* (2006.01)
*H01L 27/12* (2006.01)
(Continued)

(52) U.S. Cl.
CPC ...... *H01L 27/0248* (2013.01); *H01L 23/5286* (2013.01); *H01L 23/66* (2013.01);
(Continued)

(58) Field of Classification Search
CPC . H01L 27/0248; H01L 27/0251; H01L 23/66; H01L 27/1203; H01L 27/1214;
(Continued)

(56) References Cited

U.S. PATENT DOCUMENTS 5,786,616 A * 7/1998 Fukumoto ........... H01L 27/1203
257/350
7,719,806 B1    5/2010 Boyd et al.
(Continued)

FOREIGN PATENT DOCUMENTS

JP    H02-028348    1/1990
JP    8-331749 A    12/1996
(Continued)

OTHER PUBLICATIONS

International Search Report prepared by the Japan Patent Office dated Sep. 14, 2015, for International Application No. PCT/JP2015/069623.

*Primary Examiner* — Theresa T Doan
(74) *Attorney, Agent, or Firm* — Sheridan Ross P.C.

(57) ABSTRACT

The electrostatic protective device includes an insulator and a semiconductor layer. The semiconductor layer includes a device forming region and a device separating region. The device forming region includes a primary first conductive impurity diffused layer, a body region, a secondary first conductive impurity diffused layer, and a second conductive region that are arranged in order. The second conductive region includes a second conductive impurity diffused layer separated electrically from the body region. The device separating region includes a device separating layer that surrounds the device forming region. A gate electrode is further provided on the body region in the semiconductor layer with an insulating film interposed in between.

13 Claims, 11 Drawing Sheets

(51) Int. Cl.
*H01L 27/02* (2006.01)
*H01L 23/528* (2006.01)
*H01L 23/66* (2006.01)
*H01L 29/739* (2006.01)

(52) U.S. Cl.
CPC ........ *H01L 27/027* (2013.01); *H01L 27/1203* (2013.01); *H01L 29/7391* (2013.01)

(58) Field of Classification Search
CPC ............. H01L 27/1207; H01L 23/5286; H01L 27/027
USPC ........................................................ 257/352
See application file for complete search history.

(56) References Cited

U.S. PATENT DOCUMENTS

2006/0157791 A1* 7/2006 Lee .................... H01L 27/0251
257/357
2013/0341730 A1* 12/2013 Domanski ....... H01L 21/823892
257/379

FOREIGN PATENT DOCUMENTS

| | | |
|---|---|---|
| JP | 2000-286-424 A | 10/2000 |
| JP | 2003-209185 A | 7/2003 |
| JP | 2007-288210 | 11/2007 |
| JP | 2010-532566 | 10/2010 |
| JP | 2014-56972 A | 3/2014 |

\* cited by examiner

[ FIG. 8 ]

ELECTROSTATIC PROTECTIVE DEVICE AND ELECTROSTATIC PROTECTIVE CIRCUIT

CROSS REFERENCE TO RELATED APPLICATIONS

This application is a national stage application under 35 U.S.C. 371 and claims the benefit of PCT Application No. PCT/JP2015/069623 having an international filing date of 8 Jul. 2015, which designated the United States, which PCT application claimed the benefit of Japanese Patent Application No. 2014-152225 filed 25 Jul. 2014, the disclosures of which are incorporated herein by reference in their entirety.

TECHNICAL FIELD

The disclosure relates to an electrostatic protective circuit for protecting an electric circuit from an electrostatic discharge phenomenon, and an electrostatic protective device used for the electrostatic protective circuit.

BACKGROUND ART

In general, semiconductor integrated circuits are vulnerable to electrostatic discharge, and thus may be easily broken. One typical generation source of the electrostatic discharge is, for example, a human body in which static electricity more than 2,000 V is accumulated. Thus, when a human being handles an IC package on which a semiconductor integrated circuit is mounted without taking any protective measure for static electricity, there is a possibility that abrupt electrostatic discharge occurs, which may cause physical breakage to respective circuits and respective devices which constitute the semiconductor integrated circuit.

As a method for protecting the semiconductor integrated circuit from such electrostatic discharge, it is common to form a resistive route by inserting a diode as an electrostatic protective device to shunt a route to an electrode pad from the semiconductor integrated circuit that is a circuit to be protected. With this method, it is possible to prevent the electrostatic discharge from reaching the circuit to be protected.

On the other hand, recently, with higher-speed wireless communication in mobile information communication terminals, etc., devices that handle a high-frequency RF signal have become increasingly important. Along with miniaturization, a silicon on insulator (SOI) technique and a silicon on sapphire (SOS) technique have been indispensable for higher-speed devices. According to the SOI technique and the SOS technique, an insulating separation in a depth direction is also performed in addition to a device separation in an in-plane direction, thus allowing for a decrease in a parasitic capacitance due to shrinkage of a junction area. Thus, it is possible to achieve enhancement of RF characteristics such as high-speed operation, decrease in harmonic distortion, and enhancement of isolation characteristics indicating leakage in high-frequency signal transmission.

Along with such enhancement of the characteristics of the device, an influence of the electrostatic protective device on the RF characteristics has also become important. A case is considered in which a diode is inserted, as the electrostatic protective device, for example, between an RF signal line and a reference potential line, in order to protect, from the electrostatic discharge, an internal circuit to be connected to an input/output terminal that handles the RF signal. In this case, it is necessary for the diode as the electrostatic protective device to have a junction area from which a considerable electrostatic discharge capacity is obtained in terms of securing electrostatic resistance. On the other hand, the parasitic capacitance in proportion to the junction area possessed by the diode affects adversely to the RF characteristics such as the harmonic distortion and isolation characteristics. Thus, it has become difficult to achieve both the electrostatic resistance and the RF characteristics, because securing the electrostatic discharge capacity and the decrease in the parasitic capacitance are contradictory to each other.

In an effort to achieve both the electrostatic resistance and the RF characteristics, there have been proposed, for example, a semiconductor integrated circuit disclosed in PTL 1 and an electrostatic discharge protective device disclosed in PTL 2.

CITATION LIST

Patent Literature

PTL 1: Japanese Unexamined Patent Application Publication No. 2007-288210

PTL 2: Japanese Unexamined Patent Application Publication (Published Japanese Translation of PCT Application) No. 2010-532566

SUMMARY OF INVENTION

However, according to PTL 1, it is difficult to achieve both a capacity to protect a circuit to be protected especially in a high frequency region, and RF characteristics. Further, according to PTL 2, it is difficult to achieve miniaturization and simplification because a control circuit that controls a potential of a gate electrode is provided separately, and occurrence of a leakage current that flows to an electrostatic protective diode is also an issue.

It is therefore desirable to provide an electrostatic protective circuit that is superior in electrostatic resistance and RF characteristics and has a high capacity to protect a circuit to be protected, and an electrostatic protective device used for the electrostatic protective circuit.

An electrostatic protective device according to an embodiment of the disclosure includes an insulator, and a semiconductor layer formed on the insulator. The semiconductor layer includes a device forming region in which a primary first conductive impurity diffused layer, a body region, a secondary first conductive impurity diffused layer, and a second conductive region including a second conductive impurity diffused layer separated electrically from the body region are arranged in order, and a device separating region including a device separating layer that surrounds the device forming region. A gate electrode is further provided on the body region in the semiconductor layer with an insulating film interposed in between.

An electrostatic protective circuit according to an embodiment of the disclosure includes an insulator, and an electrostatic protective device and a semiconductor integrated circuit both formed on the insulator. The electrostatic protective device includes a semiconductor layer and a gate electrode. The semiconductor layer includes a device forming region and a device separating region. The device forming region has a primary first conductive impurity diffused layer, a body region, a secondary first conductive impurity diffused layer, and a second conductive region that are arranged in order. The second conductive region includes a second conductive impurity diffused layer separated electrically from the body region. The device separating region includes a device separating layer that surrounds the device forming region. The gate electrode is provided on the body region with an insulating film interposed in between. The semiconductor integrated circuit is provided in the semiconductor layer.

According to the electrostatic protective device and the electrostatic protective circuit of an embodiment of the disclosure, when static electricity is applied to the primary first conductive impurity diffused layer, the body region serves as a channel region to conduct an electrostatic potential to the secondary first conductive impurity diffused layer that is electrically open (i.e., in a floating state). Junction of the secondary first conductive impurity diffused layer to which the electrostatic potential is conducted and the second conductive region including the second conductive impurity diffused layer adjacent thereto is brought into a forward-bias state. Thus, a one-stage diode is formed by the junction of the secondary first conductive impurity diffused layer and the second conductive region through a channel region (body region) from the primary first conductive impurity diffused layer. Through the formation of the one-stage diode, an electrostatic discharge operation is performed. That is, the electrostatic protective device functions as the one-stage diode including one PN junction when the primary first conductive impurity diffused layer is subjected to application of static electricity, thereby allowing electrostatic discharge to be performed.

In contrast, during a normal operation, i.e., when no electrostatic discharge occurs, the electrostatic protective device function as a three-stage diode in which three PN junctions are coupled in series. More specifically, in this case, for example, a potential of the primary first conductive impurity diffused layer which serves as a signal potential is lower than a potential of a gate electrode or the second conductive region (second conductive impurity diffused layer) which serves as a power potential. Thus, the body region does not serves as the channel region. Therefore, the secondary first conductive impurity diffused layer that is electrically open maintains such a state. Further, the body region that does not serve as the channel region is also electrically open, and thus junction of the body region and the primary first conductive impurity diffused layer subjected to application of the signal potential is in a weak forward-bias state. In contrast, junction of the body region and the secondary first conductive impurity diffused layer is in a weak reverse-bias state. Further, junction of the secondary first conductive impurity diffused layer and the second conductive region that is a power potential is also in the weak reverse-bias state. As a result, a junction capacitance of the primary first conductive impurity diffused layer and the body region, a junction capacitance of the body region and the secondary first conductive impurity diffused layer, and a junction capacitance of the secondary first conductive impurity diffused layer and the second conductive region are coupled in series. The parasitic capacitance of the electrostatic protective device is reduced more sufficiently than before.

According to the electrostatic protective device and the electrostatic protective circuit as an embodiment of the disclosure, it becomes possible to achieve superior performance in a capacity to protect a circuit to be protected, electrostatic resistance, and RF characteristics. Note that an effect of the disclosure is not limited thereto, and may be any of the effects described hereinafter.

DESCRIPTION OF EMBODIMENTS

Some embodiments of the disclosure are described in detail below with reference to drawings. Note that description is given in the following order.
1. First embodiment (positive protective device)
1-1 Configuration
1-2 Operation (upon application of positive static electricity, normal time)
2. Second embodiment (input/output circuit using positive protective device)
2-1 Configuration
2-2 Operation (upon application of positive static electricity, normal time)
3. Third embodiment (negative protective device)
3-1 Configuration
3-2 Operation (upon application of negative static electricity, normal time)
4. Fourth embodiment (input/output circuit using negative protective device)
4-1 Configuration
4-2 Operation (upon application of negative static electricity, normal time)
5. Fifth embodiment (electrostatic protective circuit including positive protective device and negative protective device)
5-1 Configuration
5-2 Operation upon application of positive static electricity
5-3 Operation upon application of negative static electricity
5-4 Operation during normal time
<First Embodiment>
[Configuration of Electrostatic Protective Device 1]

Figure 1A:
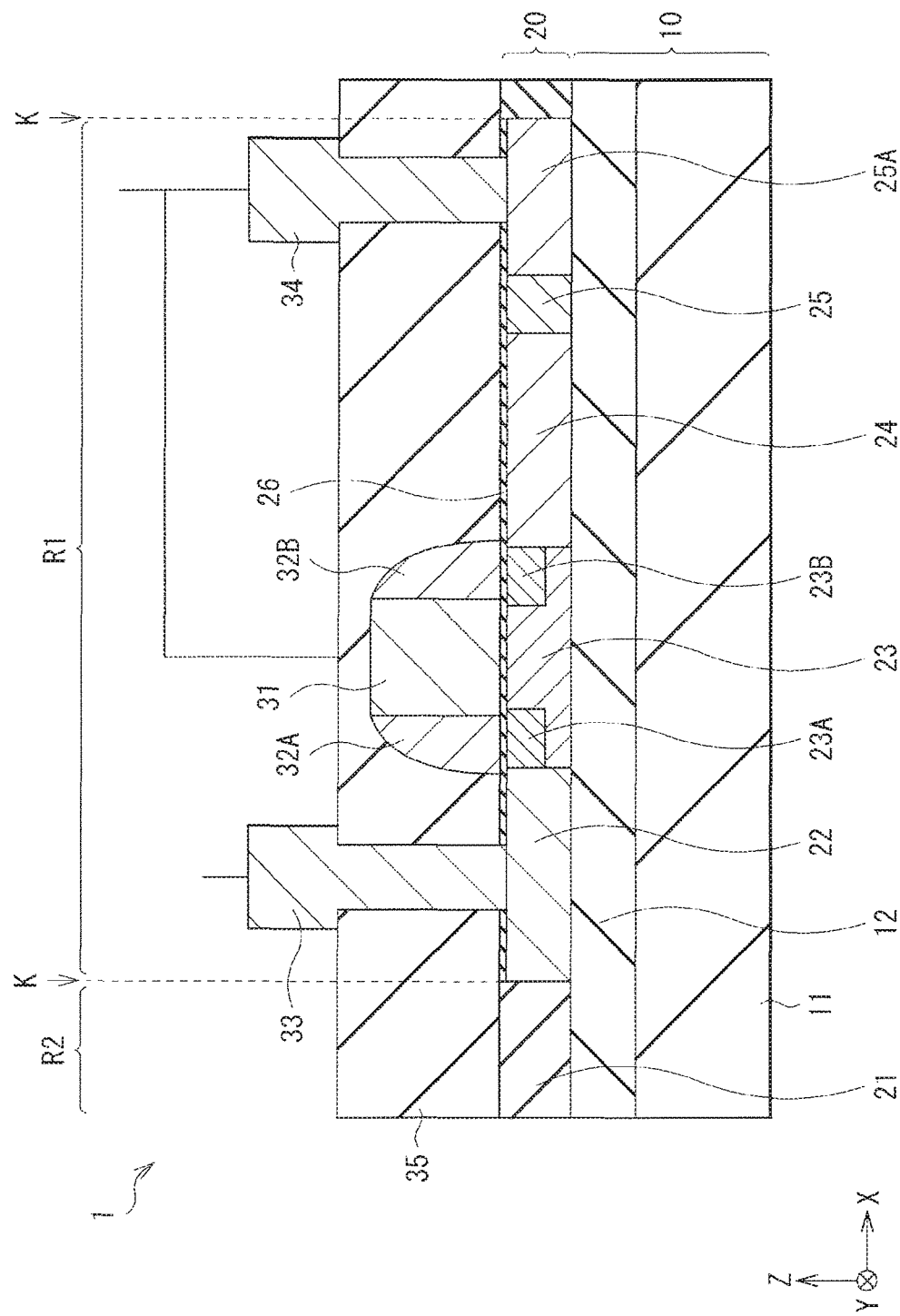
FIG. 1A is a cross-sectional view of a configuration example of an electrostatic protective device according to a first embodiment of the disclosure.
Figure 1B:
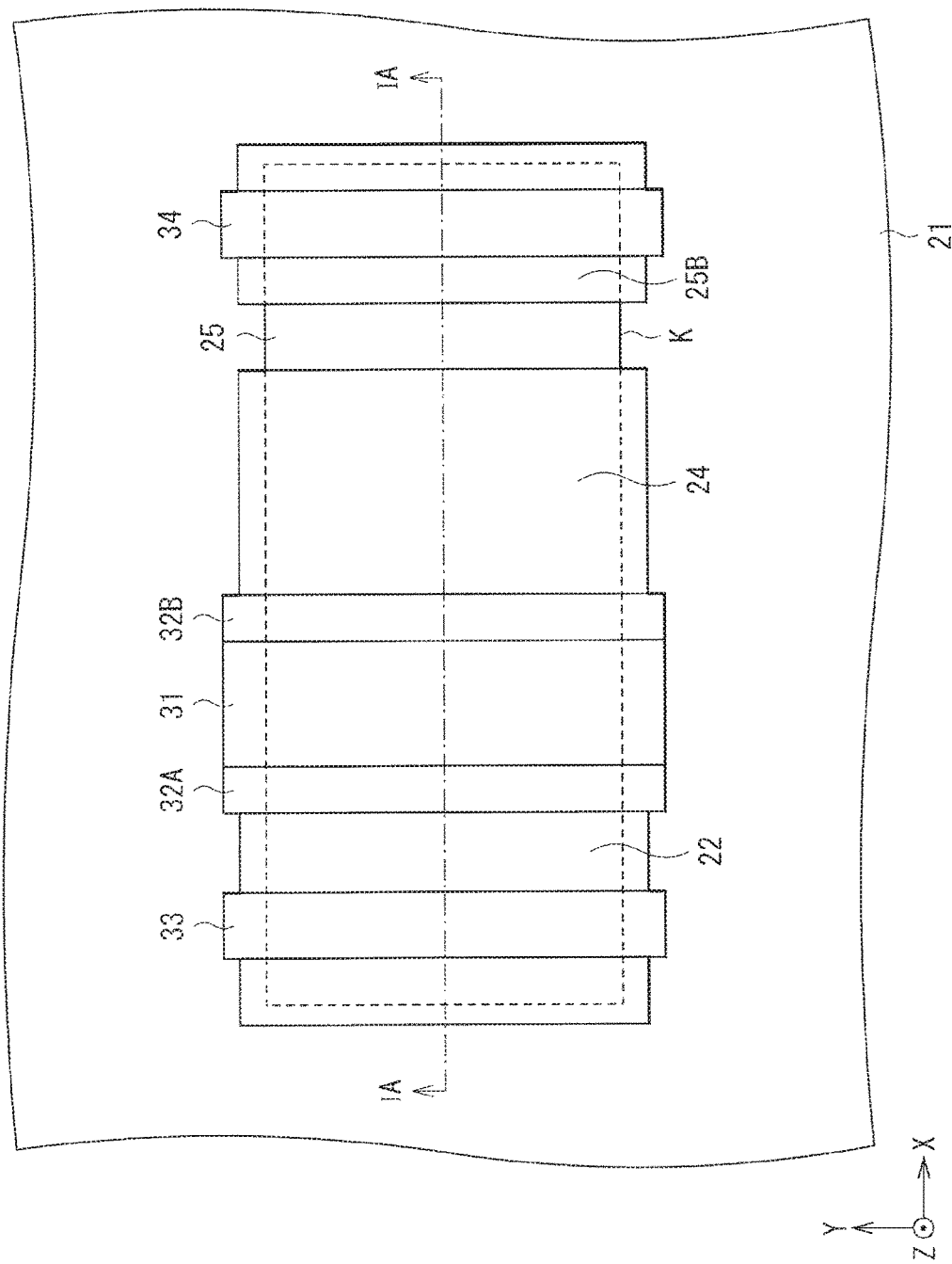
FIG. 1B is a plan view of a configuration example of the electrostatic protective device illustrated in FIG. 1A.

FIG. 1A illustrates a cross-sectional configuration of an electrostatic protective device 1 according to a first embodiment of the disclosure. Further, FIG. 1B illustrates a planar configuration of the electrostatic protective device 1. FIG. 1A corresponds to a cross-sectional view as viewed in a direction of arrows along a cut line IA-IA illustrated in FIG. 1B.

The electrostatic protective device 1 is used for protecting a circuit to be protected such as, for example, a semiconductor integrated circuit from damage due to positive electrostatic discharge. The electrostatic protective device 1 has a silicon on insulator (SOI) stricture, in which, for example, a semiconductor layer 20 and a gate electrode 31 are stacked in order on a base 10.

The base 10 has a configuration in which a thin embedded oxide film 12 made of, for example, a silicon oxide film is provided on a support substrate 11 made of, for example, single crystalline silicon. The semiconductor layer 20 is a thin film made of, for example, the single crystalline silicon, and includes a device forming region R1 and a device separating region R2 provided with a device separating layer 21 that surrounds the device forming region R1. The device separating layer 21 is an insulating film made of, for example, a silicon oxide film (SiO$_2$), and is formed using a shallow trench isolation (STI) technique, for example.

In the device forming region R1, there are arranged, in order, a P+ anode region 22 as a primary first conductive impurity diffused layer, a body region 23, a P+ potential transmission region 24 as a secondary first conductive impurity diffused layer, and a cathode region 25 including an N+ cathode region 25A as a second conductive impurity diffused layer separated electrically from the body region 23.

Paired P type low level doped drains (PLDD) 23A and 23B are provided in a portion of the body region 23. In the device forming region R1, an insulating film 26 is provided so as to cover the whole of the P+ anode region 22, the body region 23, the P+ potential transmission region 24, and the cathode region 25 including the N+ cathode region 25A. However, a portion of an upper surface of the P+ anode region 22 and a portion of an upper surface of the N+ cathode region 25A are not covered with the insulating film 26, and are coupled, respectively, to an anode electrode 33 and a cathode electrode 34.

The gate electrode 31 is provided on the body region 23 with the insulating film 26 interposed in between. Thus, a portion, of the insulating film 26, interposed between the body region 23 and the gate electrode 31 functions as a gate insulating film. Sidewall spacers 32A and 32B are adjacently provided at respective sides of the gate electrode 31, and an entire part is covered with an insulating film 35. Note that illustration of the insulating film 26 and the insulating film 35 is omitted in FIG. 1B.

The body region 23 is an N-well, and is surrounded by the P+ anode region 22, the P+ potential transmission region 24, and the device separating layer 21 in a stacked plane (in XY plane). In other words, an end surface of the body region 23 is in contact with any of the P+ anode region 22, the P+ potential transmission region 24, and the device separating layer 21. Further, the body region 23 is interposed between the embedded oxide film 12 and the insulating film 26 in the thickness direction (Z-axis direction). In other words, a lower surface of the body region 23 is in contact with the embedded oxide film 12, and an upper surface of the body region 23 is in contact with the insulating film 26.

The P+ potential transmission region 24 is surrounded by the body region 23, the cathode region 25, and the device separating layer 21 in the stacked plane (in XY plane). In other words, an end surface of the P+ potential transmission region 24 is in contact with any of the body region 23, the cathode region 25, and the device separating layer 21. Further, the P+ potential transmission region 24 is interposed between the embedded oxide film 12 and the insulating film 26 or any other insulating film such as the insulating film 35 in the thickness direction (Z-axis direction). In other words, a lower surface of the P+ potential transmission region 24 is in contact with the embedded oxide film 12, and an upper surface of the P+ potential transmission region 24 is in contact with the insulating film 26 or any other insulating film such as the insulating film 35.

With such a configuration, the body region 23 and the P+ potential transmission region 24 are isolated from surroundings so as to be in the electrically open state, i.e., in the floating state. Note that the cathode region 25 is separated electrically from the body region 23 by the P+ potential transmission region 24, the embedded oxide film 12, and the device separating layer 21.

The paired PLDD 23A and 23B formed in a portion of the body region 23 are positioned to face, respectively, the paired sidewall spacers 32A and 32B provided in a manner as to interpose the gate electrode 31. Each of the PLDD 23A and 23B is, for example, a P− impurity diffused layer formed by implanting P type impurity ions into the body region 23 after formation of the gate electrode 31.

The P+ anode region 22 and the P+ potential transmission region 24 are each made of the P+ impurity diffused layer, and are formed collectively after formation of the sidewall spacers 32A and 32B adjacently to respective sides of the gate electrode 31.

The gate electrode 31 and the N+ cathode region 25A (cathode electrode 34) may be coupled to common wiring, for example, and may have a common first potential. On the other hand, the P+ anode region 22 (anode electrode 33) has a second potential different from the first potential. As used herein, the first potential is a power potential or a reference potential, for example, and the second potential is a signal potential.

[Operation of Electrostatic Protective Device 1]

The electrostatic protective device 1 functions as a positive protective diode. In other words, the gate electrode 31 and the cathode electrode 34 are electrically coupled to have the same reference potential, and an electrostatic protective operation is started upon application of positive static electricity to the anode electrode 33. More specifically, upon application of the positive static electricity to the P+ anode region 22 from the outside when the gate electrode 31 has the reference potential, the body region 23 (N-well) immediately below the gate electrode 31 serves as a P+ channel layer. Thus, the electrostatic potential is conducted to the P+ potential transmission region 24 that is electrically open through the body region 23 serving as the P+ channel layer. Junction of the P+ potential transmission region 24 to which the electrostatic potential has been conducted and the cathode region 25 that has the reference potential is brought into the forward-bias state. Therefore, electrostatic discharge is performed from the P+ anode region 22 sequentially through the body region 23 serving as the P+ channel layer, the junction of the P+ potential transmission region 24 and the cathode region 25, the N+ cathode region 25A, and the cathode electrode 34. Thus, the electrostatic protective device 1 functions as a one-stage electrostatic protective diode including one PN junction upon application of the positive static electricity.

Description is given next of an operation of the electrostatic protective device 1 in an OFF state where the electrostatic protective device 1 does not function as the positive protective diode. The operation, in other words, is an operation of the electrostatic protective device 1 at a time after performing the electrostatic discharge, or at a time when each potential of the anode electrode 33 and the cathode electrode 34 is applied such that the electrostatic protective device 1 does not function as the positive protective diode. When the anode electrode 33 has a signal potential in a case where the cathode electrode 34 and the gate electrode 31 each have the power potential, the P+ anode region 22 also has the signal potential, and thus the body region 23 (N-well) immediately below the gate electrode 31 does not serve as the channel region. This is because the signal potential is lower than the power potential. Accordingly, the P+ potential transmission region 24 is brought into the electrically open state. Further, the body region 23 is also electrically open. Thus, junction of the P+ anode region 22 and the body region 23 is brought into the weak forward-bias state, and junction of the body region 23 and the P+ potential transmission region 24 is brought into the weak reverse-bias state. Further, junction of the P+ potential transmission region 24 and the N+ cathode region 25A that has the power potential is also brought into the reverse-bias state. As a result, the electrostatic protective device 1 is brought into the OFF state where the electrostatic protective device 1 does not function as the positive protective diode, Thus, the electrostatic protective device 1 in the OFF state is in a state where a first junction of the P+ anode region 22 and the body region 23, a second junction of the body region 23 and the P+ potential transmission region 24, and a third junction of the P+ potential transmission region 24 and the cathode region 25 are coupled in series. This makes it possible to reduce the parasitic capacitance between the anode electrode 33 and the cathode electrode 34 to about a third of that of a common gate diode structure illustrated in FIG. 8, for example. On the other hand, the electrostatic protective device 1 behaves as the one-stage electrostatic protective diode including one PN junction upon application of static electricity as described previously, and thus the electrostatic protective operation is performed at a voltage that is about a third of that in a case where three PN junctions are simply coupled in series.

Thus, the electrostatic protective device 1 according to the present embodiment functions as the one-stage electrostatic protective diode that performs electrostatic discharge via a proper route upon application of positive static electricity, and functions as a diode including three PN junctions coupled in series during a normal operation other than the application of positive static electricity. Therefore, it is possible to suppress the lowering of impedance especially in a high frequency signal by reducing the parasitic capacitance during the normal operation while securing high capacity for protection from electrostatic discharge, thus achieving high isolation characteristics. Further, the electrostatic protective device 1 has a simple configuration, and thus is able to be fabricated easily by following a procedure similar to that for a common PMOS transistor.

<Second Embodiment>

[Configuration of Input/Output Circuit including Electrostatic Protective Device 1]

Figure 2A:
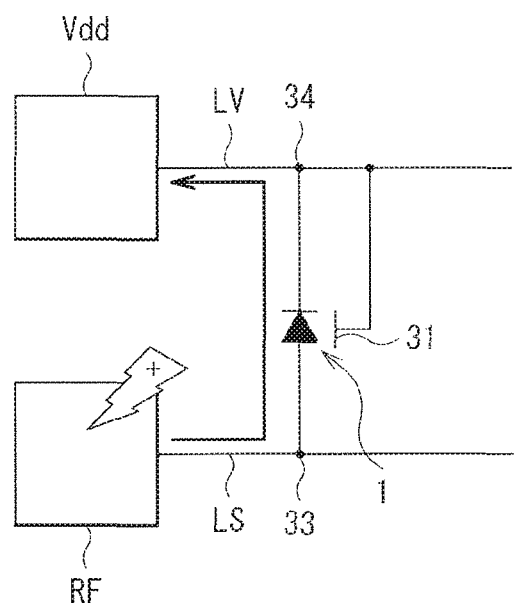
FIG. 2A describes an operation of an input/output circuit according to a second embodiment of the disclosure, including the electrostatic protective device of FIG. 1A.
Figure 2B:
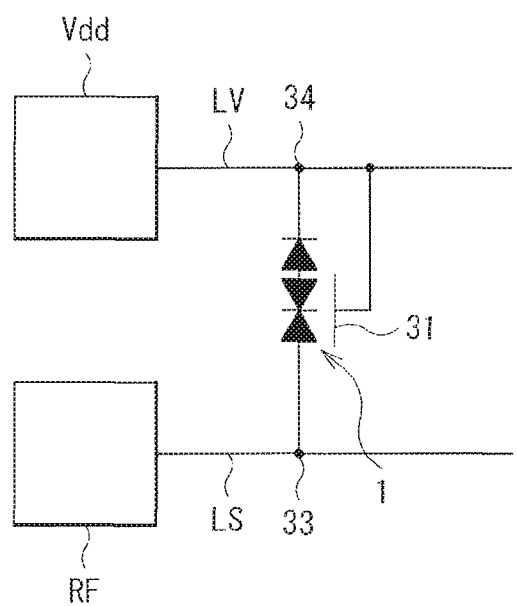
FIG. 2B describes another operation of the input/output circuit according to the second embodiment of the disclosure, including the electrostatic protective device of FIG. 1A.

FIGS. 2A and 2B illustrate an example of an input/output circuit using the electrostatic protective device 1. The input/output circuit illustrated in FIGS. 2A and 2B constitute a portion of a semiconductor integrated circuit (not illustrated) that is a circuit to be protected. FIG. 2A describes a configuration of the input/output circuit using the electrostatic protective device 1 as well as an electrostatic protective operation of the electrostatic protective device 1 upon application of positive static electricity to the input/output circuit. Further, FIG. 2B describes a configuration of the input/output circuit using the electrostatic protective device 1 and a state of the electrostatic protective device 1 during normal operation of the semiconductor integrated circuit including the input/output circuit.

In the input/output circuit illustrated in FIGS. 2A and 2B, the gate electrode 31 and the cathode electrode 34 of the electrostatic protective device 1 are coupled to a power potential line LV, and the anode electrode 33 of the electrostatic protective device 1 is coupled to a signal potential line LS. A pad Vdd for applying a power to the semiconductor integrated circuit is coupled to the power potential line LV, and a pad RF for supplying input/output signals of the semiconductor integrated circuit is coupled to the signal potential line LS.

[Operation of Input/Output Circuit Including Electrostatic Protective Device 1]

In a state where the pad Vdd is grounded to cause the power potential line LV to have a reference potential, when positive static electricity with reference to the reference potential is applied to the pad RF, the electrostatic protective device 1 starts the electrostatic protective operation (FIG. 2A). When positive static electricity is applied to the P+ anode region 22 through the signal potential line LS from the pad RF in a case where the pad Vdd is grounded and the gate electrode 31 has the reference potential, the body region 23 (N-well) immediately below the gate electrode 31 serves as the P+ channel layer. Thus, the electrostatic potential is conducted to the P+ potential transmission region 24 that is electrically open through the body region 23 serving as the P+ channel layer. The junction of the P+ potential transmission region 24 to which the electrostatic potential has been conducted and the cathode region 25 having the reference potential is brought into the forward-bias state. Thus, the electrostatic discharge finally reaches the power potential line LV that has the reference potential from the P+ anode region 22 sequentially through the body region 23 serving as the P+ channel layer, the junction of the P+ potential transmission region 24 and the cathode region 25, the N+ cathode region 25A, and the cathode electrode 34. Thus, the electrostatic protective device 1 functions as the one-stage electrostatic protective diode including one PN junction upon application of the positive static electricity.

Description is given next, with reference to FIG. 2B, of a case where the power potential is applied to the pad Vdd and the signal potential is applied to the pad RF during normal operation of the semiconductor integrated circuit (not illustrated) that is a circuit to be protected. In this case, the power potential is applied to the cathode electrode 34 and the gate electrode 31 via the power potential line LV, and the anode electrode 33 is allowed to have the signal potential via the signal potential line LS from the pad RF. This also causes the P+ anode region 22 to have the signal potential, and thus the body region 23 (N-well) immediately below the gate electrode 31 does not serve as a channel region. This is because the signal potential is lower than the power potential. Accordingly, the P+ potential transmission region 24 is brought into the electrically open state. Further, the body region 23 is also electrically open. Thus, the junction of the P+ anode region 22 and the body region 23 (N-well) is brought into the weak forward-bias state, and the junction of the body region 23 (N-well) and the P+ potential transmission region 24 is brought into the weak reverse-bias state. Further, the junction of the P+ potential transmission region 24 and the cathode region 25 that has the power potential is also brought into the reverse-bias state. As a result, the electrostatic protective device 1 is brought into the OFF state where the electrostatic protective device 1 does not function as the positive protective diode. Thus, the electrostatic protective device 1 in the OFF state is in a state where the first junction of the P+ anode region 22 and the body region 23, the second junction of the body region 23 and the P+ potential transmission region 24, and the third junction of the P+ potential transmission region 24 and the cathode region 25 are coupled in series. This makes it possible to reduce the parasitic capacitance between the anode electrode 33 and the cathode electrode 34 to about a third of that of the common gate diode structure illustrated in FIG. 8, for example.

Thus, the input/output circuit including the electrostatic protective device 1 according to the present embodiment functions as the one-stage electrostatic protective diode that performs electrostatic discharge via a proper route upon application of positive static electricity, and functions as a diode including three PN junctions coupled in series during a normal operation other than the application of positive static electricity. Therefore, it is possible to suppress the lowering of impedance especially in a high frequency signal by reducing the parasitic capacitance during the normal operation while securing high capacity for protection from electrostatic discharge, thus achieving high isolation characteristics.

<Third Embodiment>

[Configuration of Electrostatic Protective Device 2]

Figure 3:
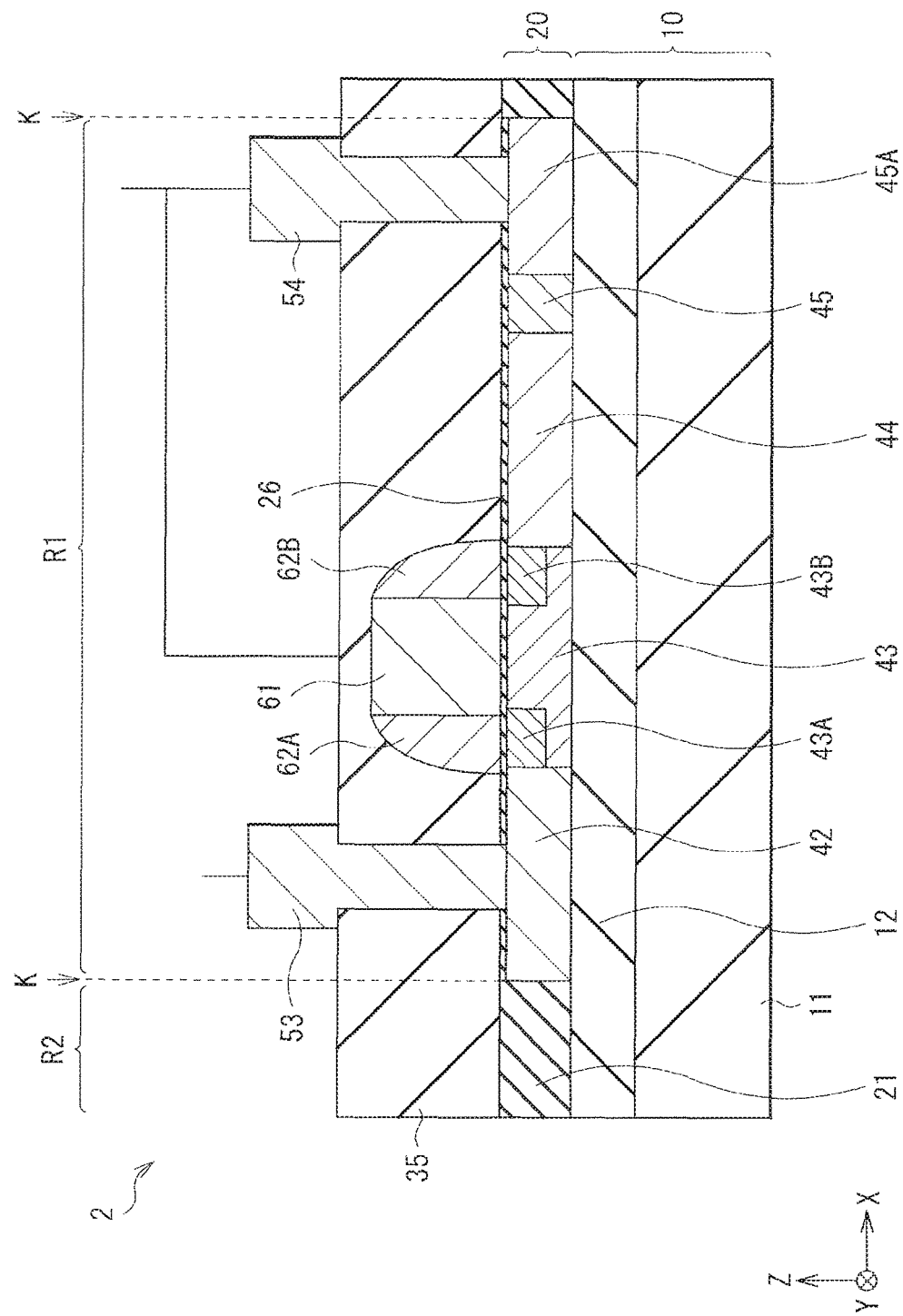
FIG. 3 is a cross-sectional view of a configuration example of an electrostatic protective device according to a third embodiment of the disclosure.

FIG. 3 illustrates a cross-sectional configuration of an electrostatic protective device 2 according to a third embodiment of the disclosure. The electrostatic protective device 2 is used for protecting a circuit to be protected such as, for example, a semiconductor integrated circuit from damage due to negative electrostatic discharge. In the following, description is given mainly of differences from the electrostatic protective device 1 described above in the first embodiment. The same reference symbol is assigned to a component overlapping that of the electrostatic protective device 1, and description therefor is omitted where appropriate.

In the device forming region R1 in the electrostatic protective device 2, there are arranged, in order, an N+ cathode region 42 as the primary first conductive impurity diffused layer, a body region 43 that is a P-well, an N+ potential transmission region 44 as the secondary first conductive impurity diffused layer, and an anode region 45 including a P+ anode region 45 as the second conductive impurity diffused layer separated electrically from the body region 43. Paired N type low level doped drains (NLDD) 43A and 43B are provided in a portion of the body region 43. In the device forming region R1, an insulating film 26 is provided so as to cover the whole of the N+ cathode region 42, the body region 43, the N+ potential transmission region 44, and the anode region 45 including the P+ anode region 45A. However, a portion of an upper surface of the N+ cathode region 42 and a portion of an upper surface of the P+ anode region 45A are not covered with the insulating film 26, and are coupled, respectively, to a cathode electrode 53 and an anode electrode 54.

The electrostatic protective device 2 further includes a gate electrode 61. The gate electrode 61 is provided on the body region 43 with the insulating film 26 interposed in between. Thus, a portion, of the insulating film 26, interposed between the body region 43 and the gate electrode 61 functions as a gate insulating film. Sidewall spacers 62A and 62B are adjacently provided at respective sides of the gate electrode 61, and an entire part is covered with the insulating film 35.

The body region 43 is the P-well, and is surrounded by the N+ cathode region 42, the N+ potential transmission region 44, and the device separating layer 21 in a stacked plane (in XY plane). In other words, an end surface of the body region 43 is in contact with any of the N+ cathode region 42, the N+ potential transmission region 44, and the device separating layer 21. Further, the body region 43 is interposed between the embedded oxide film 12 and the insulating film 26 in the thickness direction (Z-axis direction). In other words, a lower surface of the body region 43 is in contact with the embedded oxide film 12, and an upper surface of the body region 43 is in contact with the insulating film 26.

The N+ potential transmission region 44 is surrounded by the body region 43, the anode region 45, and the device separating layer 21 in a stacked plane (in XY plane). In other words, an end surface of the N+ potential transmission region 44 is in contact with any of the body region 43, the anode region 45, and the device separating layer 21. Further, the N+ potential transmission region 44 is interposed between the embedded oxide film 12 and the insulating film 26 in the thickness direction (Z-axis direction). In other words, a lower surface of the N+ potential transmission region 44 is in contact with the embedded oxide film 12, and an upper surface of the N+ potential transmission region 44 is in contact with the insulating film 26.

With such a configuration, the body region 43 and the N+ potential transmission region 44 are isolated from surroundings so as to be in the electrically open state, i.e., in the floating state. Note that the anode region 45 is separated electrically from the body region 43 by the N+ potential transmission region 44, the embedded oxide film 12, and the device separating layer 21.

The paired NLDD 43A and 43B formed in a portion of the body region 43 are positioned to face, respectively, the paired sidewall spacers 62A and 62B provided in a manner as to interpose the gate electrode 61. Each of the NLDD 43A and 43B is, for example, an N− impurity diffused layer formed by implanting N type impurity ions into the body region 43 after formation of the gate electrode 61.

The N+ cathode region 42 and the N+ potential transmission region 44 are each made of an N+ impurity diffused layer, and are formed collectively after formation of the sidewall spacers 62A and 62B adjacently to respective sides of the gate electrode 61.

The gate electrode 61 and the P+ anode region 45A (anode electrode 54) may be coupled to common wiring, for example, and may have a common first potential. On the other hand, the N+ cathode region 42 (cathode electrode 53) has a second potential different from the first potential. As used herein, the first potential is a power potential or a reference potential, for example, and the second potential is a signal potential.

[Operation of Electrostatic Protective Device 2]

The electrostatic protective device 2 functions as a negative protective diode. In other words, the gate electrode 61 and the anode electrode 54 are electrically coupled to have the same reference potential, and an electrostatic protective operation is started upon application of negative static electricity to the cathode electrode 53. More specifically, upon application of the negative static electricity to the N+ cathode region 42 from the outside when the gate electrode 61 has the reference potential, the body region 43 (P-well) immediately below the gate electrode 61 serves as an N+ channel layer. Thus, the electrostatic potential is conducted to the N+ potential transmission region 44 that is electrically open through the body region 43 serving as the N+ channel layer. Junction of the N+ potential transmission region 44 to which the electrostatic potential has been conducted and the anode region 45 that has the reference potential is brought into the forward-bias state. Therefore, electrostatic discharge is performed from the N+ cathode region 42 sequentially through the body region 43 serving as the N+ channel layer, the junction of the N+ potential transmission region 44 and the anode region 45, the P+ anode region 45A, and the anode electrode 54. Thus, the electrostatic protective device 2 functions as the one-stage electrostatic protective diode including one PN junction upon application of the negative static electricity.

Description is given next of an operation of the electrostatic protective device 2 in an OFF state where the electrostatic protective device 2 does not function as the negative protective diode. The operation, in other words, is an operation of the electrostatic protective device 2 at a time after performing the electrostatic discharge, or at a time when each potential of the anode electrode 54 and the cathode electrode 53 is applied such that the electrostatic protective device 2 does not function as the negative protective diode. When the cathode electrode 53 has a signal potential in a case where the anode electrode 54 and the gate electrode 61 each have the reference potential, the N+ cathode region 42 also has the signal potential, and thus the body region 43 (P-well) immediately below the gate electrode 61 does not serve as the channel region. This is because the signal potential is higher than the reference potential. Accordingly, the N+ potential transmission region 44 is brought into the electrically open state. Further, the body region 43 is also electrically open. Thus, junction of the N+ cathode region 42 and the body region 43 is brought into the reverse-bias state, and junction of the body region 43 and the N+ potential transmission region 44 is brought into the weak forward-bias state. Further, junction of the N+ potential transmission region 44 and the anode region 45 that has the reference potential is also brought into the reverse-bias state. As a result, the electrostatic protective device 2 is brought into the OFF state where the electrostatic protective device 2 does not function as the negative protective diode. Thus, the electrostatic protective device 2 in the OFF state is in a state where a first junction of the N+ cathode region 42 and the body region 43, a second junction of the body region 43 and the N+ potential transmission region 44, and a third junction of the N+ potential transmission region 44 and the anode region 45 are coupled in series. This makes it possible to reduce the parasitic capacitance between the cathode electrode 53 and the anode electrode 54 to about a third of that of the common gate diode structure illustrated in FIG. 8, for example.

Thus, the electrostatic protective device 2 according to the present embodiment functions as the one-stage electrostatic protective diode that performs electrostatic discharge via a proper route upon application of negative static electricity, and functions as a diode including three PN junctions coupled in series during a normal operation other than the application of negative static electricity. Therefore, it is possible to suppress the lowering of impedance especially in a high frequency signal by reducing the parasitic capacitance during the normal operation while securing high capacity for protection from electrostatic discharge, thus achieving high isolation characteristics.

<Fourth Embodiment>

[Configuration of Input/Output Circuit including Electrostatic Protective Device 2]

Figure 4A:
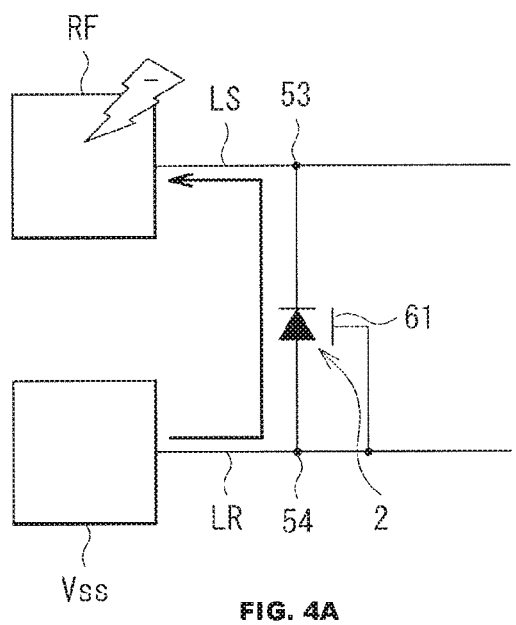
FIG. 4A describes an operation of an input/output circuit according to a fourth embodiment of the disclosure, including the electrostatic protective device of FIG. 3.
Figure 4B:
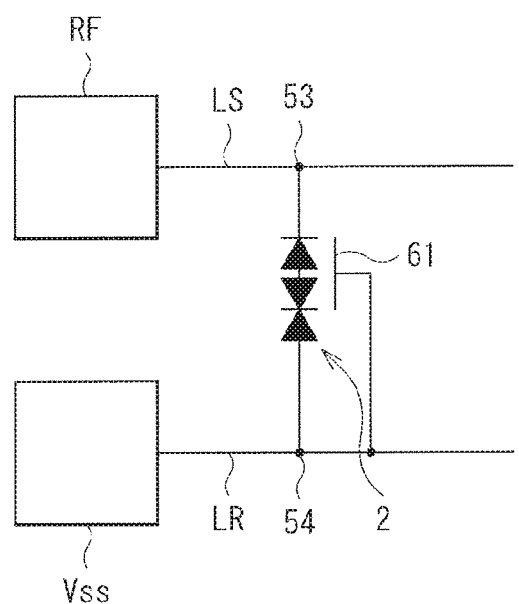
FIG. 4B describes another operation of the input/output circuit according to the fourth embodiment of the disclosure, including the electrostatic protective device of FIG. 3.

FIGS. 4A and 4B illustrate an example of an input/output circuit using the electrostatic protective device 2. The input/output circuit illustrated in FIGS. 4A and 4B constitute a portion of a semiconductor integrated circuit (not illustrated) that is a circuit to be protected. FIG. 4A describes a configuration of the input/output circuit using the electrostatic protective device 2 as well as an electrostatic protective operation of the electrostatic protective device 2 upon application of negative static electricity to the input/output circuit. Further, FIG. 4B describes a configuration of the input/output circuit using the electrostatic protective device 2 and a state of the electrostatic protective device 2 during normal operation of a semiconductor integrated circuit including the input/output circuit.

In the input/output circuit illustrated in FIGS. 4A and 4B, the gate electrode 61 and the anode electrode 54 of the electrostatic protective device 2 are coupled to a reference potential line LR, and the cathode electrode 53 of the electrostatic protective device 2 is coupled to the signal potential line LS. A pad Vss for grounding the semiconductor integrated circuit is coupled to the reference potential line LR, and the pad RF for supplying input/output signals of the semiconductor integrated circuit is coupled to the signal potential line LS.

[Operation of Input/Output Circuit including Electrostatic Protective Device 2]

In a state where the pad Vss is grounded to cause the reference potential line LR to have a reference potential, the electrostatic protective device 2 starts the electrostatic protective operation (FIG. 4A) when negative static electricity with reference to the reference potential is applied to the pad RF. When negative static electricity is applied to the N+ cathode region 42 through the signal potential line LS from the pad RF in a case where the gate electrode 61 has the reference potential, the body region 43 (P-well) immediately below the gate electrode 61 serves as the N+ channel layer. Thus, the electrostatic potential is conducted to the N+ potential transmission region 44 that is electrically open through the body region 43 serving as the N+ channel layer. The junction of the N+ potential transmission region 44 to which the electrostatic potential has been conducted and the anode region 45 having the reference potential is brought into the forward-bias state. Thus, the electrostatic discharge finally reaches the signal potential line LS that has the signal potential from the P+ anode region 45A sequentially through the junction of the anode region 45 and the N+ potential transmission region 44, the body region 43 serving as the N+ channel layer, the N+ cathode region 42, and the cathode electrode 53. Thus, the electrostatic protective device 2 functions as the one-stage electrostatic protective diode including one PN junction upon application of the negative static electricity.

Description is given next, with reference to FIG. 4B, of a case where the pad Vss is grounded and the signal potential is applied to the pad RF during normal operation of the semiconductor integrated circuit (not illustrated) that is a circuit to be protected. In this case, the reference potential is applied to the anode electrode 54 and the gate electrode 61 via the reference potential line LR, and the cathode electrode 53 is allowed to have the signal potential via the signal potential line LS. This also causes the N+ cathode region 42 to have the signal potential, and thus the body region 43 (P-well) immediately below the gate electrode 61 does not serve as a channel region. This is because the signal potential is higher than the reference potential. Accordingly, the N+ potential transmission region 44 is brought into the electrically open state. Further, the body region 43 is also electrically open. Thus, the junction of the N+ cathode region 42 and the body region 43 (P-well) is brought into the reverse-bias state, and the junction of the body region 43 (P-well) and the N+ potential transmission region 44 is brought into the weak forward-bias state. Further, the junction of the N+ potential transmission region 44 and the anode region 45 that has the reference potential is brought into the reverse-bias state. As a result, the electrostatic protective device 2 is brought into the OFF state where the electrostatic protective device 2 does not function as the negative protective diode. Thus, the electrostatic protective device 2 in the OFF state is in a state where the first junction of the N+ cathode region 42 and the body region 43, the second junction of the body region 43 and the N+ potential transmission region 44, and the third junction of the N+ potential transmission region 44 and the anode region 45 are coupled in series. This makes it possible to reduce the parasitic capacitance between the cathode electrode 53 and the anode electrode 54 to about a third of that of the common gate diode structure illustrated in FIG. 8, for example.

Thus, the input/output circuit including the electrostatic protective device 2 according to the present embodiment functions as the one-stage electrostatic protective diode that performs electrostatic discharge via a proper route upon application of negative static electricity, and functions as a diode including three PN junctions coupled in series during a normal operation other than the application of negative static electricity. Therefore, it is possible to suppress the lowering of impedance especially in a high frequency signal by reducing the parasitic capacitance during the normal operation while securing high capacity for protection from electrostatic discharge, thus achieving high isolation characteristics.

<Fifth Embodiment>

[Configuration of Electrostatic Protective Circuit including Electrostatic Protective Device 1 and Electrostatic Protective Device 2]

Figure 5A:
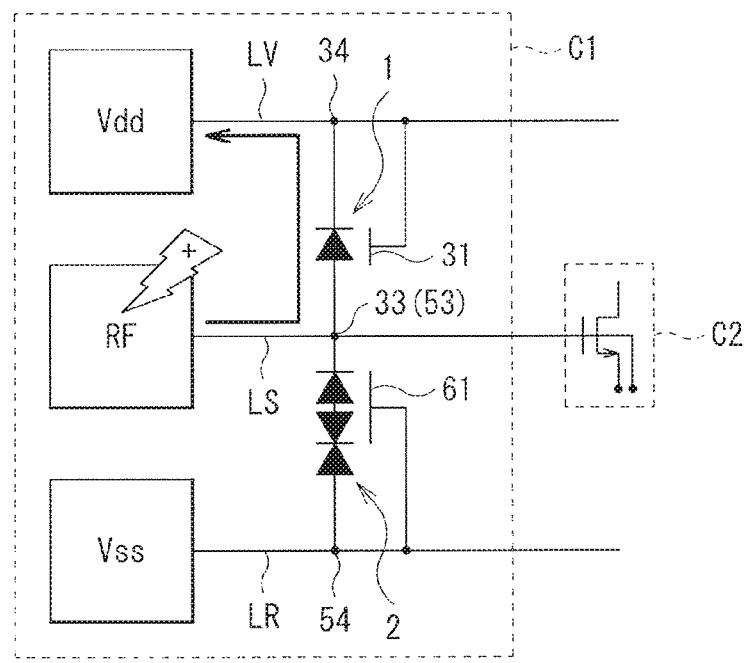
FIG. 5A describes an electrostatic protective operation for positive static electricity in an electrostatic protective circuit according to a fifth embodiment of the disclosure.
Figure 5B:
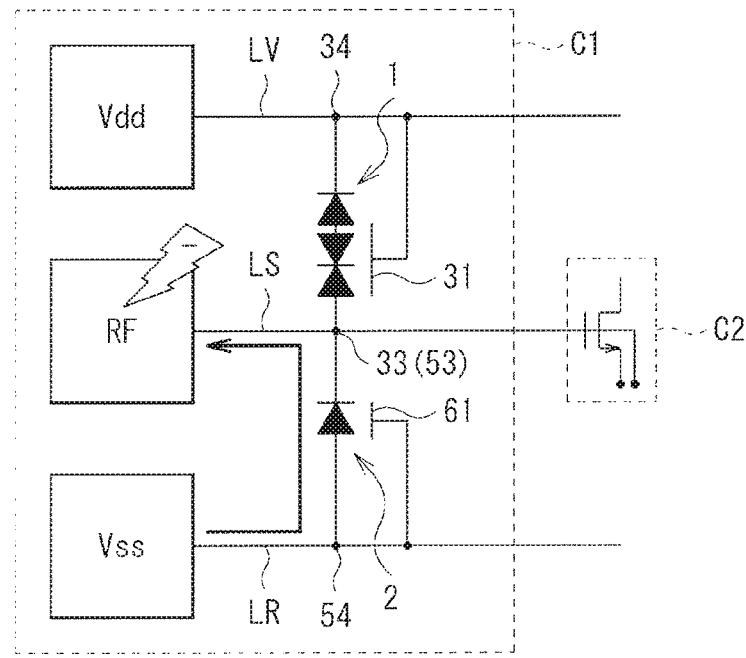
FIG. 5B describes an electrostatic protective operation for negative static electricity in the electrostatic protective circuit according to the fifth embodiment of the disclosure.
Figure 5C:
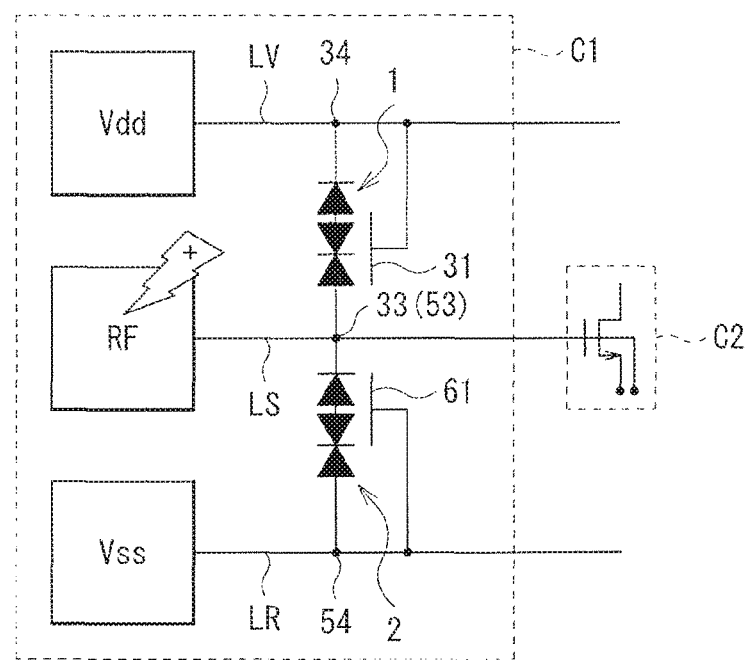
FIG. 5C describes a normal operation in the electrostatic protective circuit according to the fifth embodiment of the disclosure.

FIGS. 5A to 5C illustrate an example of an electrostatic protective circuit provided with an input/output circuit including the electrostatic protective device 1 and the electrostatic protective device 2. The electrostatic protective circuit illustrated in FIGS. 5A to 5C are each provided, for example, on the same base 10, with an input/output circuit C1 including the electrostatic protective device 1 and the electrostatic protective device 2, and a semiconductor integrated circuit C2 (internal circuit) that is a circuit to be protected.

FIG. 5A describes a configuration of an electrostatic protective circuit according to the present embodiment as well as an electrostatic protective operation in a case where positive static electricity is applied to the input/output circuit C1 of the electrostatic protective circuit. Further, FIG. 5B describes a configuration of the electrostatic protective circuit according to the present embodiment as well as an electrostatic protective operation in a case where negative static electricity is applied to the input/output circuit C1 of the electrostatic protective circuit. Furthermore, FIG. 5C describes a configuration of the electrostatic protective circuit according to the present embodiment as well as states of the electrostatic protective devices 1 and 2 during normal operation of the semiconductor integrated circuit C2 of the electrostatic protective circuit.

[Configuration of Electrostatic Protective Circuit]

As illustrated in FIGS. 5A to 5C, the input/output circuit C1 in the electrostatic protective circuit has a configuration, in which the gate electrode 31 and the cathode electrode 34 of the electrostatic protective device 1 described in the first embodiment are coupled to the power potential line LV. On the other hand, the anode electrode 33 of the electrostatic protective device 1 is coupled to the signal potential line LS. The pad Vdd for applying a power to the semiconductor integrated circuit C2 is coupled to the power potential line LV, and the pad RF for supplying input/output signals of the semiconductor integrated circuit C2 is coupled to the signal potential line LS.

The input/output circuit C1 further has a configuration, in which the gate electrode 61 and the anode electrode 54 of the electrostatic protective device described in the third embodiment are coupled to the reference potential line LR, and the cathode electrode 53 of the electrostatic protective device 2 is coupled to the signal potential line LS. The pad Vss for grounding the semiconductor integrated circuit C2 is coupled to the reference potential line LR.

The semiconductor integrated circuit C2 is coupled, for example, to an end portion opposite to the pad RF, of the signal potential line LS in the input/output circuit C1.

[Operation of Electrostatic Protective Circuit]

When the pad Vdd is grounded to cause the power potential line LV to have a reference potential, and positive static electricity with reference to the reference potential is applied to the pad RF, the electrostatic protective device 1 starts the electrostatic protective operation for the semiconductor integrated circuit C2 (FIG. 5A). The electrostatic protective operation for the positive static electricity is as described in the foregoing first and second embodiments. The electrostatic protective device 1 functions as the one-stage electrostatic protective diode including the junction of the P+ potential transmission region 24 and the cathode region 25.

Thus, when the electrostatic discharge is performed by the electrostatic protective device 1 for the positive static electricity, the other electrostatic protective device 2 is in the OFF state described in the foregoing third and fourth embodiments. Thus, when the pad Vss is grounded to cause the reference potential line LR to have a reference potential, and negative static electricity with reference to the reference potential is applied to the pad RF, the electrostatic protective device 2 starts the electrostatic protective operation for the semiconductor integrated circuit C2 (FIG. 5B). The electrostatic protective operation for the negative static electricity is as described in the foregoing third and fourth embodiments. The electrostatic protective device 2 functions as the one-stage electrostatic protective diode including the junction of the N+ potential transmission region 44 and the anode region 45. Thus, when the electrostatic discharge is performed by the electrostatic protective device 2 for the negative static electricity, the other electrostatic protective device 1 is in the OFF state described in the foregoing first and second embodiments.

As heretofore described, the electrostatic protective circuit includes the electrostatic protective device 1 and the electrostatic protective device 2, thus allowing a proper protective operation to be performed for the semiconductor integrated circuit C2 upon application of both the positive static electricity and the negative static electricity.

In contrast, when the semiconductor integrated circuit C2 is under normal operation, the electrostatic protective device 1 and the electrostatic protective device 2 are both in the OFF state (FIG. 5C). In other words, the electrostatic protective device 1 is in the OFF state described in the foregoing first and second embodiments, and the electrostatic protective device 2 is in the OFF state described in the foregoing third and fourth embodiments. Therefore, under normal operation, the electrostatic protective device 1 and the electrostatic protective device 2 both function as a diode including three PN junctions coupled in series. The electrostatic protective device 1 and the electrostatic protective device 2 are able to suppress the lowering of impedance especially in a high frequency signal by reducing own parasitic capacitance, thus achieving high isolation characteristics.

[Common Electrostatic Protective Circuit]

Figure 6A:
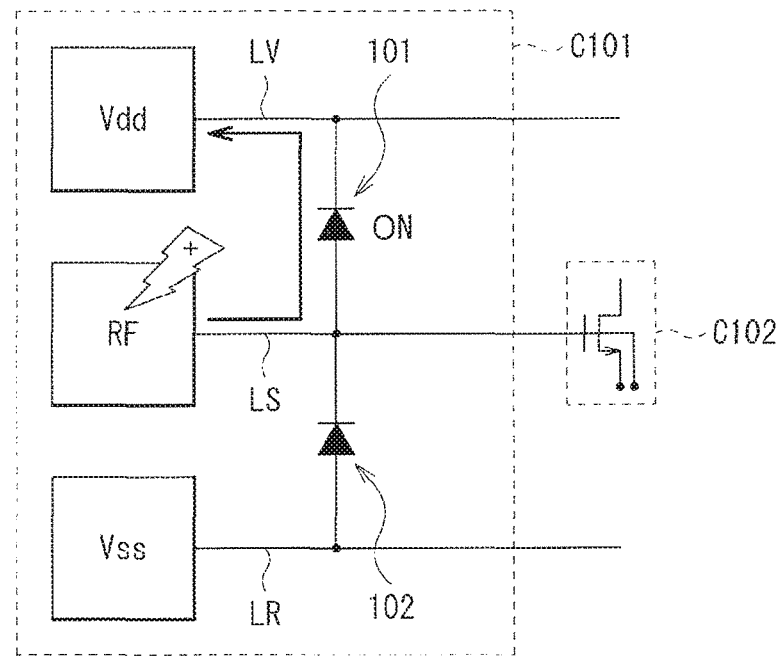
FIG. 6A describes an electrostatic protective operation or positive static electricity in a common electrostatic protective circuit.
Figure 6B:
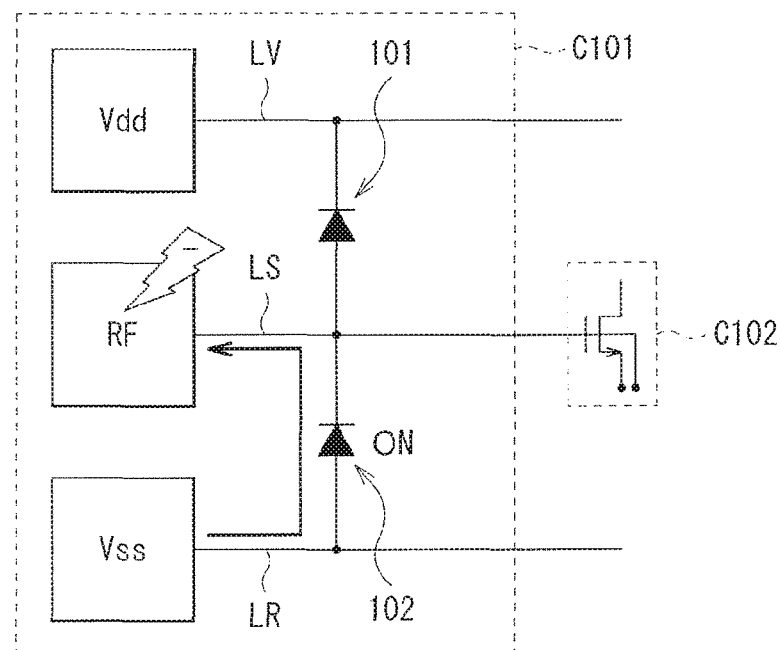
FIG. 6B describes an electrostatic protective operation for negative static electricity in the common electrostatic protective circuit.
Figure 6C:
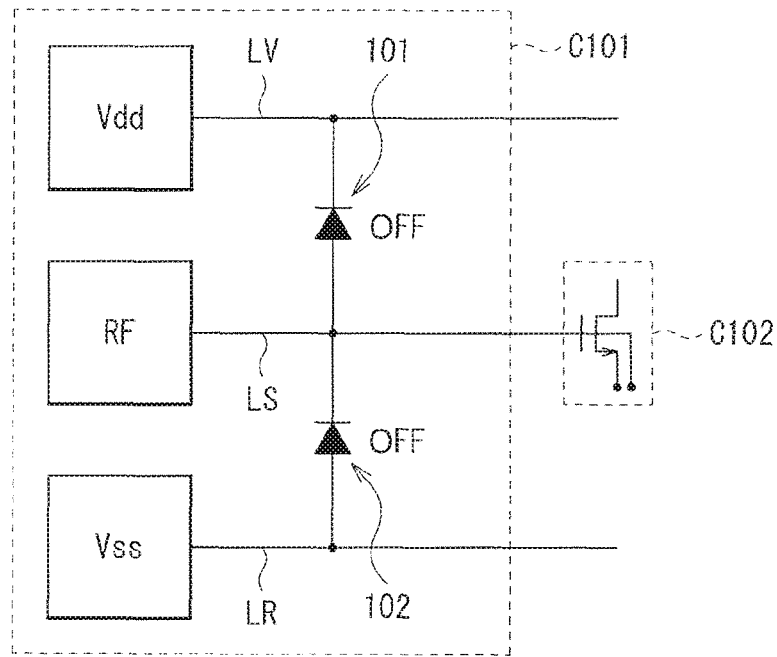
FIG. 6C describes a normal operation in the common electrostatic protective circuit.

FIGS. 6A to 6C describe an example of an electrostatic protective operation performed by a common electrostatic protective circuit using a diode as the electrostatic protective device. As illustrated in FIGS. 6A to 6C, as the common electrostatic protective circuit, an electrostatic protective circuit is contemplated that includes an input/output circuit C101 and a semiconductor integrated circuit C102. A positive protective diode 101 is inserted between the power potential line LV and the signal potential line LS, with an anode terminal of the positive protective diode 101 being coupled to the signal potential line LS, and a cathode terminal thereof being coupled to the power potential line LV. Further, a negative protective diode 102 is inserted between the signal potential line LS and the reference potential line LR, with an anode terminal of the negative protective diode 102 being coupled to the reference potential line LR, and a cathode terminal thereof being coupled to the signal potential line LS. A pad RF is coupled to one end of the signal potential line LS, and the semiconductor integrated circuit C102 is coupled to the other end thereof.

As illustrated in FIG. 6A, when the potential of the power potential line LV is used as a reference potential to apply positive static electricity with reference to the reference potential to the pad RF coupled to the signal potential line LS, the positive protective diode 101 operates in a forward direction. Accordingly, the static electricity is discharged to the power potential line LV via the positive protective diode 101 from the signal potential line LS. Further, as illustrated in FIG. 6B, when the reference potential line LR is used as a reference potential to apply negative static electricity with reference to the reference potential to the pad RF coupled to the signal potential line LS, the negative protective diode 102 operates in a forward direction. Accordingly, the static electricity is discharged to the signal potential line LS via the negative protective diode 102 from the reference potential line LR. Thus, the positive protective diode and the negative protective diode operate in a forward direction, respectively, to static electricity having a positive polarity and static electricity having a negative polarity to perform electrostatic discharge, thereby making it possible to protect the internal circuit.

In contrast, the normal operation of the integrated circuit (IC) has a relationship of power potential Vdd>signal potential Vrf>reference potential Vss, and thus a reverse bias is applied to both the positive protective diode 101 and the negative protective diode 102 to be turned OFF (FIG. 6C), Accordingly, the power potential line LV, the signal potential line LS, and the reference potential line LR are separated electrically from one another, and a power potential and signals necessary for the IC operation are applied to the internal circuit (not illustrated).

However, as the RF signal to be handled has higher frequency, more attention is necessary particularly on the influence of the parasitic capacitance of the negative protective diode on the RF characteristics, in other words, an allowable value of the parasitic capacitance of the protective diode is determined from the viewpoint of whether it is possible to prevent leakage of high-frequency signals (whether it is possible to allow for isolation). This is because the impedance is lowered more to deteriorate the isolation performance, as the signal to be handled has higher frequency, and as the protective diode has a larger parasitic capacitance. When the impedance is lowered to cause the RF signal to be leaked to the reference potential line LR, there occur signal transmission loss and signal waveform distortion. Therefore, an attempt is made to reduce the size of the protective diode to thereby reduce the parasitic capacitance so as not to sacrifice the RF characteristics. However, along with the reduction in the size, there occur the lowering of the electrostatic resistance and the lowering of the capacity to protect the internal circuit, thus making it difficult to achieve both the electrostatic resistance and the RF characteristics.

Figure 7:
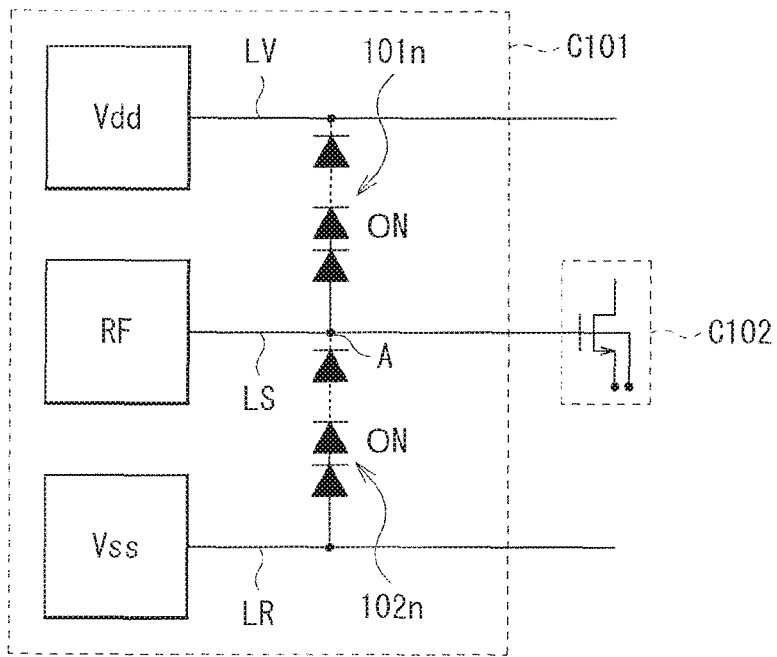
FIG. 7 describes an electrostatic protective circuit as a reference example.

Previously-mentioned PTL 1 attempts to solve an issue of achieving both the electrostatic resistance and the RF characteristics. Specifically, PTL 1 discloses that multiple-stage positive protective diodes 101n and multiple-stage negative protective diodes 102n are coupled in series, as illustrated in FIG. 7. Under the normal IC operation, the protective diode can be regarded as capacitance. Therefore, coupling a plurality of protective diodes in a multiple-stage manner makes it possible to: reduce the capacitance; suppress the lowering of impedance especially in high-frequency signals; and improve the isolation characteristics. However, in order to turn on, for example, an n-stage protective diode upon application of static electricity, the ON-voltage of the n-stage protective diode is n×Von, where Von denotes the ON-voltage of one protective diode, from the viewpoint of electrostatic protective resistance. This means that, even when static electricity is applied, electrostatic discharge is not performed until the voltage reaches n×Von. When Vt1 denotes the voltage at the start of electrostatic discharge, Vt1=Von holds true in the case of one-stage protective diode, whereas Vt1=n×Von holds true in the case of n-stage protective diode. Accordingly, the potential at point A (FIG. 7) immediately after the start of the electrostatic discharge also increases from Von to n×Von. Further, when Ron denotes the resistance during the ON-state of one-stage protective diode, n×Ron holds true in the case of the n-stage diode. When It2 denotes a current flowing to the protective diode during electrostatic discharge that reaches required electrostatic resistance, a potential V at the point A is represented as follows:

$$V = n \cdot Von + It2 \times n \cdot Ron = n(Von + It2 \cdot Ron)$$

(V=Von+It2·Ron in the case of one-stage protective diode).

An increase in the potential at the point A by the n-stage protective diode may possibly cause the lowering of the capacity to protect the internal circuit such as causing breakage beyond the gate withstand voltage of a MOS transistor, for example, constituting the internal circuit illustrated in FIG. 7. Thus even if the electrostatic resistance of the electrostatic protective device per se is able to be secured, the capacity to protect the internal circuit is lowered, and it becomes more difficult to achieve both the capacity to protect internal devices and the RF characteristics, as the signal has higher frequency.

Figure 8:
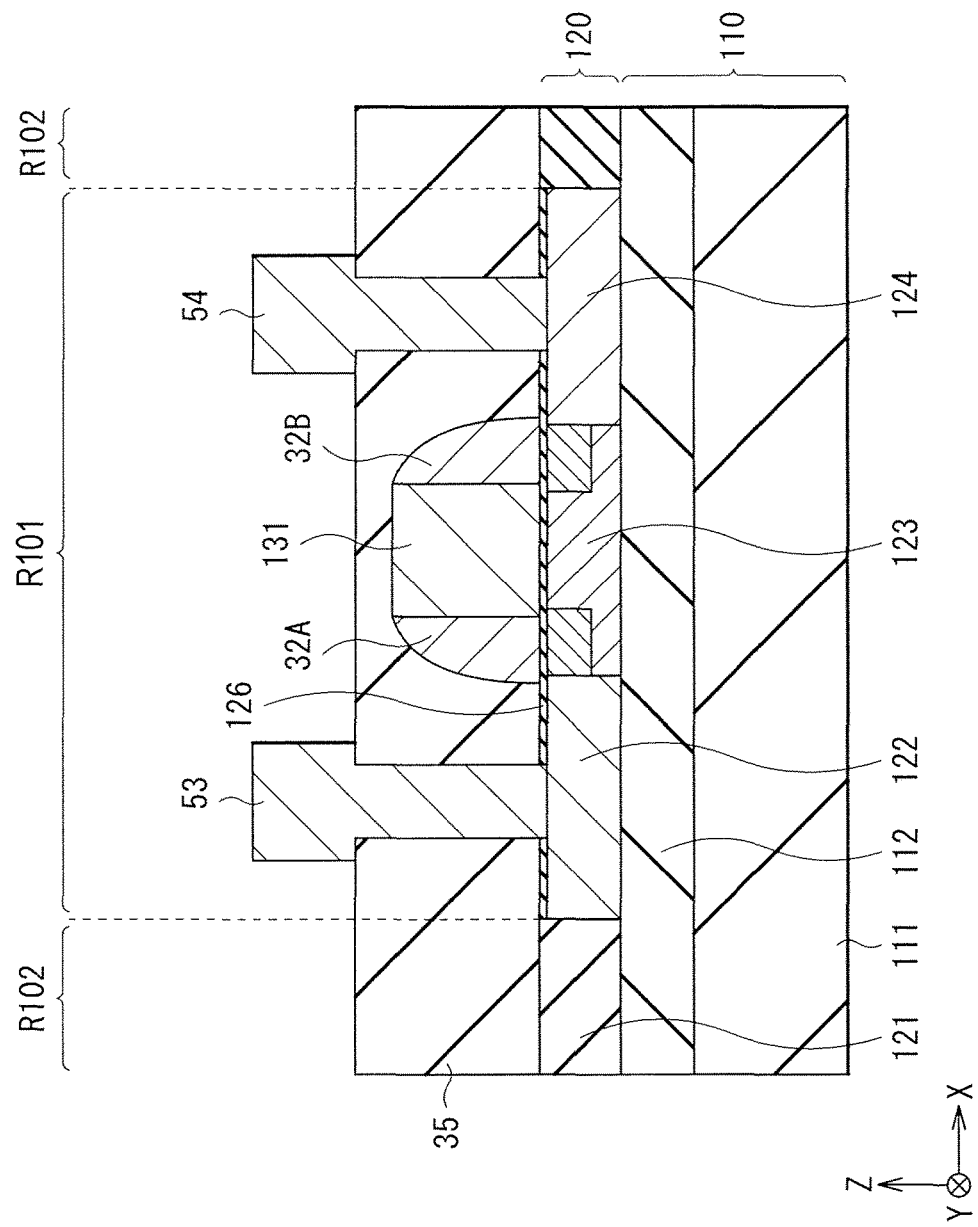
FIG. 8 is a cross-sectional view of a configuration of a protective diode applied to the common electrostatic protective circuit illustrated in FIGS. 6A to 6C.

Here, description is given of a structure of a common protective diode that is able to be used for the foregoing electrostatic protective circuit illustrated in FIGS. 6A to 6C and FIG. 7. FIG. 8 illustrates a cross-sectional structure diagram of so-called common Gated diode using an SOI substrate. The Gated diode is formed on a semiconductor layer surrounded by a device separating region. In the diode, a semiconductor layer 120 is provided on a base 110 in which an embedded oxide film 112 is formed on a support substrate 111. In a device forming region R101 of the semiconductor layer 120, an N+ impurity diffused layer 122, a body region 123, and a P+ impurity diffused layer 124 are arranged in order in an in-plane direction. A device separating layer 121 is provided in a device separating region R102 surrounding the device forming region R101. A gate electrode 131 is formed on the body region 123 with an insulating film 126 being formed in between so as to cover a portion of the semiconductor layer 120. When the protective diode illustrated in FIG. 8 is used as the positive protective diode in the electrostatic protective circuits in FIGS. 6A to 6C and FIG. 7, the P+ impurity diffused layer 124 is coupled to the signal potential line LS, and the N+ impurity diffused layer 122 is coupled to the power potential line LV. The gate electrode 131 is coupled to the signal potential line LS or the power potential line LV.

Coupling as described above allows junction of the body region 123 and the N+ impurity diffused layer 122 to be forward biased in the positive protective diode to cause the positive protective diode to operate in the forward direction, thus performing electrostatic discharge, when the power potential line LV is used as a reference potential to apply positive static electricity with reference to the reference potential to the signal potential line LS.

In contrast, when the protective diode illustrated in FIG. 8 is used as the negative protective diode in the electrostatic protective circuits in FIGS. 6A to 6C and FIG. 7, the P+ impurity diffused layer 124 is coupled to the reference potential line LR, and the N+ impurity diffused layer 122 is coupled to the signal potential line LS. The gate electrode 131 is coupled to the reference potential line LR or the signal potential line LS.

Coupling as described above allows the junction of the body region 123 and the N+ impurity diffused layer 122 to be forward biased in the negative protective diode to cause the positive protective diode to operate in the forward direction, thus performing electrostatic discharge, when the reference potential line LR is used as a reference potential to apply negative static electricity with reference to the reference potential to the signal potential line LS.

Thus, even if the electrostatic resistance of the electrostatic protective device per se is able to be secured as described above, the capacity to protect the internal circuit is lowered, and it becomes more difficult to achieve both the capacity to protect internal devices and the RF characteristics, as the signal has higher frequency.

Previously-mentioned PTL 2 attempts to solve an issue of achieving both the capacity to protect internal devices and the RF characteristics. PTL 2 discloses that a potential of the gate electrode is controlled with a control circuit provided separately to cause the protective diode to function as one-stage diode that operates at Vt1=Von during the operation of the electrostatic discharge, and cause the protective diode to function as a two-stage diode coupled in series during the normal IC operation. However, an increase in the size is unavoidable, caused by an increase in the area as a result of providing the control circuit separately. Moreover, PTL 2 discloses that an electrostatic protective diode between a reference potential line and a potential line to be protected is coupled in a forward direction, and thus an increase in a leak current during the IC operation is also considered to be unavoidable.

Figure 9:
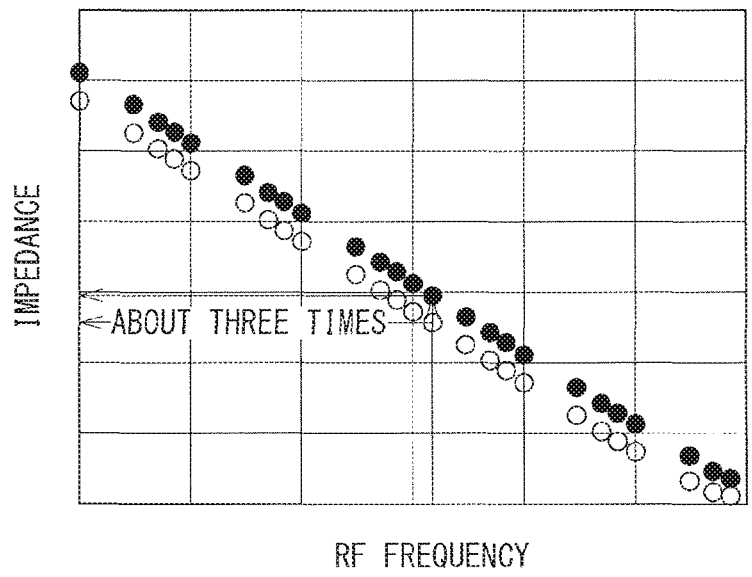
FIG. 9 is a characteristic diagram illustrating a relationship between a frequency and impedance, in an electrostatic protective device mounted on the electrostatic protective circuit illustrated in FIGS. 5A to 5C.
Figure 10:
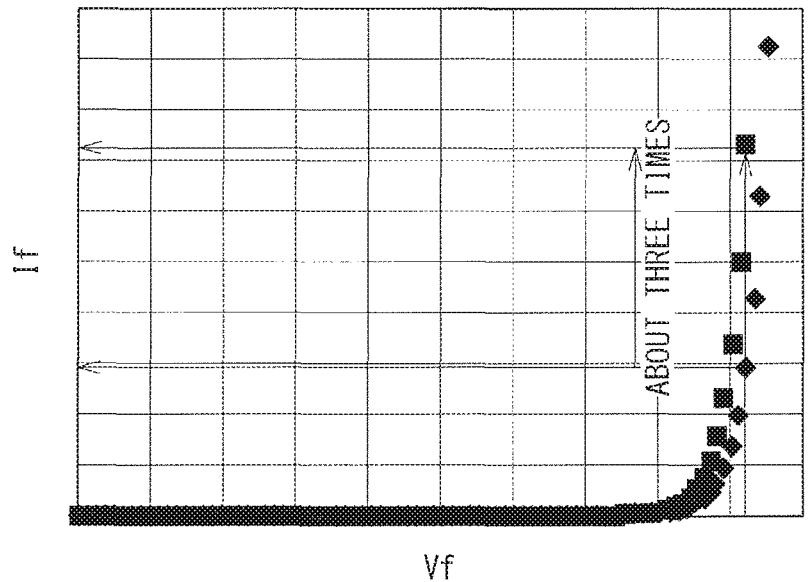
FIG. 10 is a characteristic diagram illustrating a relationship between a voltage and a current, in the electrostatic protective device mounted on the electrostatic protective circuit illustrated in FIGS. 5A to 5C.

In contrast, the electrostatic protective circuit according to the disclosure is advantageous in miniaturization of overall configuration. In addition, it is possible to achieve superior performances such as a capacity to protect a circuit to be protected, electrostatic resistance, and RF characteristics. This is because the electrostatic protective devices 1 and 2 each function as a one-stage protective diode during the electrostatic protective operation, whereas the electrostatic protective devices 1 and 2 each function as a three-stage protective diode to which a reverse bias is applied during the normal operation of the semiconductor integrated circuit C2. According to the electrostatic protective devices 1 and 2 of the disclosure, the parasitic capacitance between the anode and the cathode is a third of that of the common protective diode illustrated in FIG. 8, and it can also be said that the isolation characteristics for the RF signal is about three times, or the impedance is about three times, as illustrated in the characteristic diagram in FIG. 9, for example. In FIG. 9, the horizontal axis indicates RF frequency, and the vertical axis indicates impedance. Further, the black circle symbol "●" in the diagram indicates the characteristics of the electrostatic protective devices 1 and 2 of the disclosure, and the white circle symbol "○" in the diagram indicates the characteristics of the common protective diode illustrated in FIG. 8. Alternatively, suppose that the electrostatic protective devices 1 and 2 of the disclosure each have a parasitic capacitance equivalent to that of the common protective diode illustrated in FIG. 8, the current capacity of the electrostatic protective devices 1 and 2 of the disclosure is about three times that of the common protective diode, as illustrated in FIG. 10, for example. In FIG. 10, the horizontal axis indicates voltage Vf, and the vertical axis indicates current If. Further, the black square symbol "■" in the diagram indicates the characteristics of the electrostatic protective devices 1 and 2 of the disclosure, and the black lozenge symbol "♦" in the diagram indicates the characteristics of the common protective diode illustrated in FIG. 8. Thus, the RF characteristics and the electrostatic resistance are both achieved.

Although the present disclosure have been described heretofore with reference to some embodiments, the disclosure is by no means limited to the foregoing embodiments, and various modifications are possible.

Although the description has been given, in the foregoing embodiments, of the case where the electrostatic protective device has the SOI structure, for example, the present technology is by no means limited thereto. For example, the electrostatic protective device may also have a silicon-on-sapphire (SOS) structure. In this case, a sapphire substrate may be used in place of the support substrate 11 and the embedded oxide film 12.

Further, the present disclosure is by no means limited to those which include all the components described in the foregoing embodiments.

Note that the effects described in the specification are merely illustrative and non-limiting, and may be effects other than those described above. Note that the technology may have the following configurations.

(1)
An electrostatic protective device including:
an insulator;
a semiconductor layer formed on the insulator, and including a device forming region and a device separating region,
the device forming region having a primary first conductive impurity diffused layer, a body region, a secondary first conductive impurity diffused layer, and a second conductive region that are arranged in order, the second conductive region including a second conductive impurity diffused layer separated electrically from the body region,
the device separating region including a device separating layer that surrounds the device forming region; and
a gate electrode provided on the body region with an insulating film interposed in between.

(2)
The electrostatic protective device according to (1), wherein
the gate electrode and the second conductive impurity diffused layer have a common first potential, and
the primary first conductive impurity diffused layer has a second potential.

(3)
The electrostatic protective device according to (2), wherein
the first potential is a power potential or a reference potential, and
the second potential is a signal potential.

(4)
The electrostatic protective device according to any one of (1) to (3), wherein the body region is surrounded by the primary first conductive impurity diffused layer, the secondary first conductive impurity diffused layer, and the device separating layer in an in-plane direction, and is interposed between the insulator and the insulating film in a thickness direction.

(5)
The electrostatic protective device according to any one of (1) to (4), wherein the secondary first conductive impurity diffused layer is surrounded by the body region, the second conductive region, and the device separating layer in an in-plane direction, and is interposed between the insulator and the insulating film or any other insulating film in a thickness direction.

(6)
The electrostatic protective device according to any one of (1) to (5), wherein
each of the primary first conductive impurity diffused layer and the secondary first conductive impurity diffused layer is a P type impurity diffused layer, and
the second conductive impurity diffused layer is an N type impurity diffused layer.

(7)
The electrostatic protective device according to (6), wherein
the gate electrode and the second conductive impurity diffused layer have a common power potential, and
the primary first conductive impurity diffused layer has a signal potential.

(8)
The electrostatic protective device according to (6) or (7), wherein
the primary first conductive impurity diffused layer is coupled to an anode electrode, and
the second conductive impurity diffused layer is coupled to a cathode electrode.

(9)
The electrostatic protective device according to any one of (1) to (5), wherein
each of the primary first conductive impurity diffused layer and the secondary first conductive impurity diffused layer is an N type impurity diffused layer, and
the second conductive impurity diffused layer is a P type impurity diffused layer.

(10)
The electrostatic protective device according to (9), wherein
the gate electrode and the second conductive impurity diffused layer have a common reference potential, and
the primary first conductive impurity diffused layer has a signal potential.

(11)
The electrostatic protective device according to (9) or (10), wherein
the primary first conductive impurity diffused layer is coupled to a cathode electrode, and
the second conductive impurity diffused layer is coupled to an anode electrode.

(12)
The electrostatic protective device according to any one of (1) to (11), wherein the insulator is an embedded oxide film in a silicon on insulator (SOI) structure or a sapphire substrate in a silicon-on-sapphire (SOS) structure.

(13)
An electrostatic protective circuit including: an insulator; and an electrostatic protective device and a semiconductor integrated circuit both formed on the insulator, the electrostatic protective device including a semiconductor layer and a gate electrode, the semiconductor layer having a device forming region and a device separating region,
the device forming region having a primary first conductive impurity diffused layer, a body region, a secondary first conductive impurity diffused layer, and a second conductive region that are arranged in order, the second conductive region including a second conductive impurity diffused layer separated electrically from the body region, the device separating region including a device separating layer that surrounds the device forming region, the gate electrode being provided on the body region with an insulating film interposed in between, and the semiconductor integrated circuit being provided in the semiconductor layer.

(14) An electrostatic protective circuit including:

an insulator;

a semiconductor layer including a first electrostatic protective device, a second electrostatic protective device, and a semiconductor integrated circuit that are formed on the insulator;

a power potential line;

a signal potential line; and a reference potential line, the first electrostatic protective device having a primary first conductive impurity diffused layer, a first body region, a secondary first conductive impurity diffused layer, and a second conductive region that are arranged in order in the device forming region, the second conductive region including a second conductive impurity diffused layer separated electrically from the first body region, and a first gate electrode provided on the first body region with a insulating film interposed in between, and being coupled to the power potential line and the signal potential line, and the second electrostatic protective device having a primary second conductive impurity diffused layer, a second body region, a secondary second conductive impurity diffused layer, and a first conductive region that are arranged in order in the device forming region, the first conductive region including a first conductive impurity diffused layer separated electrically from the second body region, and a second gate electrode provided on the second body region with a second insulating film interposed in between, and being coupled to the reference potential line and the signal potential line.

(15) The electrostatic protective circuit according to (14), wherein the first gate electrode and the second conductive impurity diffused layer are coupled to the power potential line, the primary first conductive impurity diffused layer and the primary second conductive impurity diffused layer are coupled to the signal potential line, and the second gate electrode and the first conductive impurity diffused layer are coupled to the reference potential line.

This application is based upon and claims the benefit of priority of the Japanese Patent Application No. 2014-152225 filed with the Japan Patent Office on Jul. 25, 2014, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. An electrostatic protective device comprising:

an insulator;

a semiconductor layer formed on the insulator, the semiconductor layer including:

a device forming region having a primary impurity diffused layer of a first conductivity type adjacent to a body region, a secondary impurity diffused layer of the first conductivity type adjacent to the body region, and a conductive region adjacent to the secondary impurity diffused layer of the first conductivity type, wherein the conductive region includes an impurity diffused layer of a second conductivity type, and wherein an interface between the impurity diffused layer of the second conductivity type and the secondary impurity diffused layer touch and form a p-n junction that electrically separates the conductive region from the body region, and a device separating region including a device separating layer that surrounds the device forming region; and a gate electrode provided on the body region with an insulating film interposed in between the gate electrode and the body region.

2. The electrostatic protective device according to claim 1, wherein the gate electrode and the impurity diffused layer of the second conductivity type have a common first potential, and the primary impurity diffused layer of the first conductivity type has a second potential.

3. The electrostatic protective device according to claim 2, wherein the first potential is a power potential or a reference potential, and the second potential is a signal potential.

4. The electrostatic protective device according to claim 1, wherein the body region is surrounded by the primary impurity diffused layer of the first conductivity type, the secondary impurity diffused layer of the first conductivity type, and the device separating layer in an in-plane direction, and is interposed between the insulator and the insulating film in a thickness direction.

5. The electrostatic protective device according to claim 1, wherein the secondary impurity diffused layer of the first conductivity type is surrounded by the body region, the conductive region, and the device separating layer in an in-plane direction, and is interposed between the insulator and the insulating film or any other insulating film in a thickness direction.

6. The electrostatic protective device according to claim 1, wherein each of the primary impurity diffused layer of the first conductivity type and the secondary impurity diffused layer of the first conductivity type is a P type impurity diffused layer, and the impurity diffused layer of the second conductivity type is an N type impurity diffused layer.

7. The electrostatic protective device according to claim 6, wherein the gate electrode and the impurity diffused layer of the second conductivity type have a common power potential, and the primary impurity diffused layer of the first conductivity type has a signal potential.

8. The electrostatic protective device according to claim 6, wherein the primary impurity diffused layer of the first conductivity type is coupled to an anode electrode, and the impurity diffused layer of the second conductivity type is coupled to a cathode electrode.

9. The electrostatic protective device according to claim 1, wherein each of the primary impurity diffused layer of the first conductivity type and the secondary impurity diffused layer of the first conductivity type is an N type impurity diffused layer, and the impurity diffused layer of the second conductivity type is a P type impurity diffused layer.

10. The electrostatic protective device according to claim 9, wherein the gate electrode and the impurity diffused layer of the second conductivity type have a common reference potential, and the primary impurity diffused layer of the first conductivity type has a signal potential.

11. The electrostatic protective device according to claim 9, wherein the primary impurity diffused layer of the first conductivity type is coupled to a cathode electrode, and the impurity diffused layer of the second conductivity type is coupled to an anode electrode.

12. The electrostatic protective device according to claim 1, wherein the insulator is an embedded oxide film in a silicon on insulator (SOI) structure or a sapphire substrate in a silicon-on-sapphire (SOS) structure.

13. An electrostatic protective circuit comprising:
an insulator; and
an electrostatic protective device and a semiconductor integrated circuit both formed on the insulator, the electrostatic protective device including a semiconductor layer and a gate electrode, the semiconductor layer including:
a device forming region having a primary impurity diffused layer of a first conductivity type adjacent to a body region, a secondary impurity diffused layer of the first conductivity type adjacent to the body region, and a conductive region adjacent to a secondary impurity diffused layer of the first conductivity type, wherein the conductive region includes an impurity diffused layer of a second conductivity type, and wherein an interface between the impurity diffused layer of the second conductivity type and the secondary impurity diffused layer touch and form a p-n junction that electrically separates the conductive region from the body region, and
a device separating region including a device separating layer that surrounds the device forming region,
wherein the gate electrode is provided on the body region with an insulating film interposed in between the gate electrode and the body region, and the semiconductor integrated circuit is provided in the semiconductor layer.

* * * * *